United States Patent [19]

Akiyoshi et al.

[11] Patent Number: 5,587,450
[45] Date of Patent: Dec. 24, 1996

[54] PROCESS FOR PRODUCING AROMATIC POLYAMIDE FILM

[75] Inventors: Kazunori Akiyoshi; Masahiro Niwano, Tsukuba, both of Japan

[73] Assignee: Sumitomo Chemical Company, Limited, Osaka, Japan

[21] Appl. No.: 496,878

[22] Filed: Jun. 30, 1995

[30] Foreign Application Priority Data

Jul. 8, 1994 [JP] Japan ..................... 6-157399

[51] Int. Cl.⁶ ..................... C08G 69/08; C08G 73/10
[52] U.S. Cl. ..................... 528/310; 528/338; 528/339; 528/340; 528/344; 528/348; 528/183; 528/190
[58] Field of Search ..................... 528/310, 338, 528/339, 340, 344, 348, 183, 190

[56] References Cited

U.S. PATENT DOCUMENTS 5,177,175  1/1993  Kiriyama et al. ..................... 528/183

FOREIGN PATENT DOCUMENTS

| 0087305 | 8/1983 | European Pat. Off. . |
| 0091778 | 10/1983 | European Pat. Off. . |
| 54-011968 | 1/1979 | Japan . |
| 1507579 | 4/1978 | United Kingdom . |

*Primary Examiner*—James J. Seidleck
*Assistant Examiner*—Duc Truong
*Attorney, Agent, or Firm*—Watson Cole Stevens Davis P.L.L.C.

[57] ABSTRACT

A process for producing an aromatic polyamide film, which comprises the steps of: (a) forming a thin layer of an optically isotropic dope in which an aromatic polyamide is dissolved in a polar amide, (b) immersing the thin layer dope of aromatic polyamide in a polar solvent, other than said polar amide, kept at a temperature not higher than −20° C. to prepare a film, and (c) drying the film. The aromatic polyamide film thus obtained is excellent in transparency. Said process requires neither a step of dissolving an aromatic polyamide in conc. sulfuric acid nor an acid-resistant equipment, and hence, is inexpensive.

18 Claims, No Drawings

PROCESS FOR PRODUCING AROMATIC POLYAMIDE FILM

BACKGROUND OF THE INVENTION

This invention relates to a process for producing an aromatic polyamide film excellent in transparency which is used as a lens-protecting film or the like.

An aromatic polyamide, particularly all-para aromatic polyamide, is one of the polymers having the highest tensile modulus of elasticity among the heretofore known polymers.

A film obtained from the aromatic polyamide can be formed into a thin film having a thickness of several micrometers because of its very high tensile modulus, and also has excellent heat resistance because of its very high melting point or decomposition temperature.

However, the aromatic polyamide is dissolved in only special solvents having a high polarity such as con. sulfuric acid and the like and hence is difficult to handle. In addition, the aromatic polyamide has a lyotropic liquid crystallinity, so that only a devitrified, low-strength film containing a great number of crystallite is obtained by a conventional solution-casting method.

As a process for producing a transparent aromatic polyamide film, JP-A-62-246,719 discloses a process comprising separating as a polymer an aromatic polyamide obtained by polymerization in a solvent such as N-methyl-2-pyrrolidinone or the like, subsequently dissolving the polymer in con. sulfuric acid, moistening the resulting optically anisotropic, con. sulfuric acid solution at a high temperature to make it optically isotropic, subjecting the same to coagulation and washing, and then heat-treating the resulting film at a temperature of 300° to 500° C. under tension. However, said process has many steps and requires a complicated operation. In addition, the equipment to be used must be resistant to sulfuric acid. Therefore, there is such a problem that the cost becomes very high.

The present inventors have made extensive research for solving the above problems and have, as a result, found that a transparent film is obtained by forming a thin layer of an optically isotropic solution in which an aromatic polyamide is dissolved in a polar amide (this solution is hereinafter referred to as the dope in some cases), thereafter immersing the thin layer dope in a low-temperature polar solvent and then drying the same.

SUMMARY OF THE INVENTION

An object of this invention is to provide a process for producing an aromatic polyamide film which process enables the production of a transparent aromatic polyamide film having a high strength and high heat resistance directly from the aromatic polyamide dope without requiring the step of dissolving an aromatic polyamide in con. sulfuric acid and which process is excellent in productivity, does not require any acid-resistant equipment and is inexpensive.

Other objects and advantages of this invention will become apparent from the following description.

According to this invention, there is provided a process for producing an aromatic polyamide film having an excellent transparency which comprises the steps of:

(a) forming a thin layer of an optically isotropic dope in which an aromatic polyamide is dissolved in a polar amide, (b) immersing the thin layer dope in a polar solvent, other than said polar amide, kept at a temperature not higher than −20° C. to form a film, and (c) drying the film.

DETAILED DESCRIPTION OF THE INVENTION

In this invention, the optically isotropic dope in which an aromatic polyamide is dissolved in a polar amide means an optically isotropic solution of an aromatic polyamide in a polar amide solvent. The optically isotropic dope in which an aromatic polyamide is dissolved in a polar amide includes a solution obtained by polymerizing an aromatic diamine with an aromatic dicarboxylic acid halide in a polar amide solution having dissolved therein an alkali metal chloride or an alkaline earth metal chloride, and its diluted solution.

At the time of the formation of the dope, the molar ratio of the alkali (or alkaline earth) metal chloride to total amide groups in the aromatic polyamide obtained preferably falls within the range of from 1.5 to 2.5. When the ratio is less than 1.5, the shelf life of the dope obtained is short, and hence, the aromatic polyamide is unpreferably easy to be precipitated. When the ratio is more than 2.5, the alkali (or alkaline earth) metal chloride is saturated, and hence, the metal chloride is unpreferably easy to be precipitated.

In this invention, the aromatic polyamide includes, for example, all-para aromatic polyamides. The all-para aromatic polyamide is obtained by polycondensation of a para-oriented aromatic diamine with a para-oriented aromatic dicarboxylic acid halide and comprises the recurring units that the amide linkage is bonded to the aromatic ring at its para position. The all-para aromatic polyamide includes specifically poly(para-phenylene terephthalamide) obtained by polycondensation of para-phenylenediamine with terephthalic acid dichloride.

The all-para aromatic polyamide may contain, in addition to the above-mentioned units, amide linkage, ether linkage, ester linkage, urethane linkage, urea linkage or imide linkage having, for example, an ortho-oriented aromatic, meta-oriented aromatic, nuclear-substituted aromatic, diphenyl, diphenyl ether or aliphatic skeleton in such a range that the effect of this invention is not damaged.

The aromatic polyamide includes, specifically, those composed of the following recurring structural units (A) and (B):

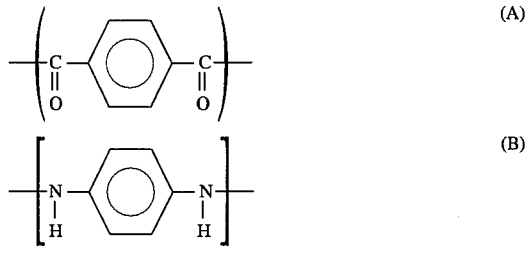

The molar ratio of the unit (A) to the unit (B) in the aromatic polyamide preferably falls within the range of from 48:52 to 52:48. When the molar ratio of the unit (A) to the unit (B) is less than 48:52 or more than 52:48, molecular weight of the aromatic polyamide obtained unpreferably becomes low.

Aromatic polyamides including, in addition to the above recurring structural units (A) and (B), a small proportion of the following recurring structural unit (C) and aromatic polyamides composed of the following recurring structural unit (C) are also included in the aromatic polyamide:

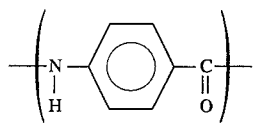
(C)

The molar ratio of the unit (C) to the total of the unit (A) and the unit (B) in the aromatic polyamide is preferably 50:50 or less, more preferably 20:80 or less. When the molar ratio of the unit (C) to the total of the unit (A) and the unit (B) is more than 50:50, sometimes the strength of the aromatic polyamide obtained unpreferably becomes low.

The aromatic polyamide used in this invention has preferably an inherent viscosity of 1.0–2.5 dl/g. When the inherent viscosity is less than 1.0 dl/g, the strength of the film becomes low and when it is more than 2.5 dl/g, the viscosity of the aromatic polyamide becomes very high and deposition of the aromatic polyamide is observed, and hence, the state of the dope becomes instable.

Here, the inherent viscosity is calculated by the following equation from the falling time ratio determined by measuring the falling time at 30° C. of a con. sulfuric acid solution of an aromatic polyamide having a concentration of 0.50 g/dl and the falling time at 30° C. of the same con. sulfuric acid as used in the above aromatic polyamide solution:

$$\eta=[\ln (T/T_0)]/C \text{ (unit: dl/g)}$$

wherein T: the falling time of con. sulfuric acid solution of aromatic polyamide, $T_0$: the falling time of con. sulfuric acid, C: the concentration of aromatic polyamide in the con. sulfuric acid solution of aromatic polyamide. The con. sulfuric acid used here has a purity of 97% or more.

The polar amide used in this invention includes, for example, N-methyl-2-pyrrolidinone (referred to hereinafter as NMP in some cases), N,N-dimethyl-formamide, N,N-dimethylacetamide, tetramethylurea and the like.

The concentration of the aromatic polyamide in the aromatic polyamide dope is preferably 1.0% by weight or more but 4.5% by weight or less. When the concentration of the aromatic polyamide in the aromatic polyamide dope is less than 1.0% by weight, the film strength after coagulation is so low that the film is easily broken. Also, when the aromatic polyamide concentration is more than 4.5% by weight, the dope becomes a liquid crystal phase and the film after coagulation becomes opaque.

In the process of this invention, the method of forming a thin layer of the optically isotropic dope in which the aromatic polyamide is dissolved in a polar amide is not critical, and there may be used, for example, a method comprising casting the dope on a support having a smooth surface by use of a coater such as bar coater, roll coater, doctor blade or the like or a method comprising extruding the dope through a slit.

The thickness of the thin layer dope preferably falls within the range of from 0.2 to 3.0 mm, more preferably from 0.3 to 1.0 mm, still more preferably from 0.4 to 0.8 mm. When the thickness of the thin layer dope is less than 0.2 mm, sometimes the strength of the film after coagulation unpreferably becomes low. When the thickness of the thin layer is more than 3.0 mm, sometimes the transparency of the film after coagulation unpreferably deteriorates.

As the support, there can be used a band, a film or a drum, at least the surface of which is made of a metal such as steel, stainless steel or the like; a plastic such as polyester, fluoroplastic, engineering plastic or the like; a release paper; or the like.

When the dope is cast by moving the coater side while fixing the support side, a glass plate can be used as the support in addition to the metal plate and resin plate.

Subsequently, the thin layer dope of the aromatic polyamide obtained is immersed in a polar solvent kept at a temperature not higher than −20° C. The thin layer dope is coagulated into a film in the polar solvent without losing its optical isotropy. The removal of the polar amide and salts from the film can be achieved in the coagulation step in which the polar solvent is used; however, as stated hereinafter, it is preferable to introduce a step of washing, as necessary, the film with an appropriate solvent after the coagulation solidification step.

A desired amount of the polar solvent per the thin layer dope is not critical so far as the amount is excess. The weight ratio of the polar solvent to the thin layer dope is preferably 50:1 or more, more preferably 100:1 or more, still more preferably 200:1 or more. When the ratio is less than 50:1, sometimes the thin layer is not rapidly coagulated into a film, and hence, the transparency of the film obtained unpreferably deteriorates.

The thin layer dope is immersed in the polar solvent for preferably 1 minute or more, more preferably 5 minutes or more, still more preferably 30 minutes or more. When the immersing time is less than 1 minute, sometimes the thin layer dope is not sufficiently coagulated.

The temperature at which the polar solvent is kept is not higher than −20° C., preferably not higher than −30° C., more preferably not higher than −40° C. When the temperature is higher than −20° C., the film loses its optical isotropy during the immersion in a polar solvent, and hence, only a devitrified film is obtained. A temperature not lower than 100° C. can be more easily set and hence is more advantageous in industry than temperatures lower than −100° C.

The polar solvent used in this invention is for coagulating the thin layer dope of aromatic polyamide, so that the solidifying point of the polar solvent is preferably not higher than −25° C., more preferably not higher than −35° C., still more preferably not higher than −45° C., and most preferably lower than −100° C. It is proper that the solidifying point of the polar solvent should be lower than the temperature at which the polar solvent is kept.

The dielectric constant of the polar solvent is preferably at least 20, more preferably at least 30, at 25° C.

The polar solvent is a solvent other than the polar amide used in the present invention and includes, for example, alcohols such as methanol, ethanol, 1-propanol, 1-butanol, 1,3-propanediol and the like; mixtures of the alcohol and NMP and/or water comprising the alcohol as the main component; and the like.

The aromatic polyamide coagulated (solidified) into a film by immersing the dope in the polar solvent kept at a temperature not higher than −20° C. is then, as necessary, washed with a washing solvent. The washing solvent is preferably at least one solvent selected from the group consisting of methanol, acetone and water. Methanol is most preferred.

Subsequently, the washed film is then dried. The drying is effected preferably in the state that the film is fixed with a clamp or on a frame made of a strong and solvent-resistant material such as stainless steel, wood, resin or the like for preventing the film from shrinking.

The drying conditions are not critical, and the drying may be effected by, for example, a method in which air drying, drying under reduced pressure, hot-air-circulating drying or the like is effected at a temperature of from room temperature to 450° C., preferably from room temperature to 200°

C. At a temperature exceeding 450° C., decomposition of the aromatic polyamide is caused. Also, the temperature may be set constant or elevated step-by-step or continuously.

The thickness of the film obtained after drying is not particularly critical, however, the thickness preferably falls within the range of from 0.1 to 100 µm from the view point of the strength and transparency of the film.

The process for producing an aromatic polyamide film of this invention has fewer steps and higher productivity than a conventional process for producing a film from a sulfuric acid solution, does not require any acid resistant equipment and enables the production of an aromatic polyamide film having high strength, high heat resistance and excellent transparency. In this respect, the production process of this invention is very advantageous in industry.

DESCRIPTION OF THE PREFERRED EMBODIMENTS

This invention is illustrated below referring to Examples; however, this invention should not be construed to be limited thereto.

In the Examples, the measurement of various physical properties were conducted by the following methods:
(1) Inherent viscosity The inherent viscosity in this invention was calculated according to the following equation from the falling time ratio determined by measuring the falling time at 30° C. of a con. sulfuric acid solution of an aromatic polyamide having a concentration of 0.50 g/dl and the falling time at 30° C. of the same con. sulfuric acid as used in the conc. sulfuric acid solution of aromatic polyamide:

$$\eta = [\ln(T/T_0)]/C \text{ (unit: dl/g)}$$

wherein T: the falling time of conc. sulfuric acid solution of aromatic polyamide, $T_0$: the falling time of conc. sulfuric acid, C: the concentration of aromatic polyamide in the conc. sulfuric acid solution of aromatic polyamide (g/dl).

The conc. sulfuric acid used here had a purity of 97% or more.
(2) Tensile test

A test specimen was punched from the film obtained by Dumbbell Cutter SDMK-1223 manufactured by Dumbbell Company and subjected to measurement of tensile strength and tensile modulus of elasticity using an Instron type universal tensile tester Model 4301 manufactured by Instron Japan Company according to JIS K-7127.
(3) Haze measurement The film obtained was set in the optical system of a direct reading haze computer HGM-2DP manufactured by Suga Shiken Kikai K. K. and subjected to measurement of transmitted light using a C light source.

EXAMPLES 1 TO 4

A 500-ml separable flask equipped with an anchor-shaped agitating blade, a 50-ml side tube-attached addition means, a Dimroth condenser and a three way stop-cock was sufficiently purged with nitrogen.

Into this flask were charged 15 g of $CaCl_2$ which had previously been vacuum-dried at 200° C. for at least two hours and 200 g of sufficiently dehydrated NMP, and heated with stirring at 100° C. for one hour in an oil bath. Subsequently, it was confirmed that $CaCl_2$ was sufficiently dissolved in NMP, and thereafter, the NMP solution was allowed to cool to room temperature. To this cooled NMP solution was added 3.6 g (0.033 mole) of para-phenylenediamine (referred to hereinafter as PPD) which had been weighed in a dry box and the mixture was stirred to be dissolved to prepare a NMP solution of PPD. After it was confirmed that the PPD was sufficiently dissolved, the NMP solution of PPD was cooled in an ice-water bath.

Subsequently, 6.8 g (0.033 mole) of terephthalic acid dichloride (referred to hereinafter as TPC in some cases) which had been weighed in a dry box was dissolved in 50 ml of NMP to prepare a NMP solution of TPC and the NMP solution of TPC was added to the above NMP solution of PPD from the side tube-attached addition means. The addition of the NMP solution of TPC to the NMP solution of the PPD was effected over 20 minutes while the inner temperature was kept at 0°–10° C.

After completion of the addition of the NMP solution of TPC to the NMP solution of PPD, stirring was continued for one hour while the inner temperature was kept at 0°–5° C. Subsequently, the pressure in the system was reduced by a vacuum pump for a further 30 minutes to remove the low-boiling compounds, after which nitrogen was introduced into the system to restore the inner pressure of the system to ordinary pressure and polymerization was completed.

The above-mentioned synthesis of an aromatic polyamide was conducted always under a dry nitrogen atmosphere, to prevent, as much as possible, the open air, particularly moisture, from being introduced into the system. Thus, an optically isotropic NMP solution (dope) of an aromatic polyamide was obtained. The concentration of aromatic polyamide in this dope was 2.7% by weight, and the inherent viscosity of this aromatic polyamide was 1.8 dl/g.

The thus obtained optically isotropic dope of aromatic polyamide was allowed to fall down onto a sufficiently polished glass plate and casted using a glass stick so as to form a thin layer having a thickness of about 0.4 mm.

The thus obtained thin layer dope was immersed for 30 minutes in methanol kept at a temperature as shown in Table 1 with dry ice to cool and coagulate the dope.

The film of aromatic polyamide obtained by the cooling and coagulating was sandwiched in between two ring-shaped frames made of Teflon having an inner diameter of 10 cm, an outer diameter of 15 cm and a thickness of 5 mm and fixed with clips. Incidentally, a filter paper was inserted between the Teflon frame and the film of aromatic polyamide in order to accelerate the drying of the portion sandwiched between the frames.

The film of aromatic polyamide fixed thus between the frames was air-dried for at least 12 hours to obtain a transparent aromatic polyamide film. The aromatic polyamide film thus obtained was subjected to measurement of haze value to obtain the results shown in Table 1.

Comparative Examples 1 and 2

The same procedure as in Example 1 was repeated, except that the coagulation was effected at the temperatures shown in Table 1 to prepare aromatic polyamide films, and haze values thereof were measured, to obtain the results shown in Table 1.

TABLE 1

| | Starting PPTA | Coagulating solvent | | Haze | |
|---|---|---|---|---|---|
| | η (dl/g) | King | Temp. (°C.) | value (%) | Appearance, others |
| Ex. 1 | 1.8 | Methanol | ≦−70 | 1.9 | Pale yellow, transparent |
| Ex. 2 | 1.8 | Methanol | −40 ± 2 | 6.5 | Pale yellow, |

TABLE 1-continued

| | Starting PPTA | Coagulating solvent | | Haze | |
|---|---|---|---|---|---|
| | η (dl/g) | Kind | Temp. (°C.) | value (%) | Appearance, others |
| Ex. 3 | 1.8 | Methanol | −36 ± 2 | 9.1 | Pale yellow, transparent |
| Ex. 4 | 1.8 | Methanol | −27 ± 2 | 15.4 | Pale yellow, transparent |
| Comp Ex. 1 | 1.8 | Methanol | −15 ± 2 | 52.5 | Pale yellow, considerably opaque |
| Comp. Ex. 2 | 1.8 | Methanol | 25 | — | Opaque, broken when dried |

EXAMPLE 5

A 500-ml separable flask equipped with an anchor-shaped agitating blade, a Dimroth condenser and a three way stop-cock was sufficiently purged with nitrogen.

Into this flask were charged 31.90 g of $CaCl_2$ which had previously been vacuum-dried at 200° C. for at least two hours and 463.5 g of sufficiently dehydrated NMP, and heated with stirring at 100° C. for one hour in an oil bath. After it was confirmed that the $CaCl_2$ was sufficiently dissolved in the NMP, the NMP solution was allowed to cool to room temperature. To this cooled NMP solution was added 14.62 g (0.135 mole) of PPD which had been weighed in a dry box and the mixture was stirred to dissolve the PPD in the NMP to prepare a NMP solution of PPD. After it was confirmed that the PPD was sufficiently dissolved in the NMP, the NMP solution of PPD was cooled in an ice-water bath.

Subsequently, 26.53 g (0.131 mole) of TPC which had been weighed in a dry box was added to the NMP solution of PPD. The addition of TPC was effected in several portions under a nitrogen stream over 20 minutes while the inner temperature was kept at 0°–10° C. After completion of the addition of TPC, stirring was continued for one hour while the inner temperature was kept at 0°–5° C. Subsequently, the pressure in the system was reduced by a vacuum pump for a further 30 minutes to remove the low-boiling compounds, after which nitrogen was introduced into the system to restore the inner pressure of the system to ordinary pressure, and polymerization was completed.

The above-mentioned synthesis of an aromatic polyamide was conducted always under a dry nitrogen atmosphere to prevent, as much as possible, the open air, particularly moisture, from being introduced into the system. Thus, an optically isotropic dope of an aromatic polyamide was obtained. The concentration of aromatic polyamide in this dope was 6% by weight, and the inherent viscosity of this aromatic polyamide was 1.72 dl/g.

The thus obtained optically isotropic dope of aromatic polyamide was diluted with NMP to prepare a 3% by weight optically isotropic dope of aromatic polyamide. The thus prepared aromatic polyamide dope was allowed to fall down onto a sufficiently polished glass plate and casted using an automatic coating apparatus PI-1210 manufactured by Tester Sangyo Co., Ltd. and a wedge bar manufactured by Matsuo Sangyo Co., Ltd. so as to form a thin layer having a thickness of about 0.6 mm. This thin layer was immersed for 30 minutes in methanol kept at a temperature not higher than −70° C. with dry ice to cool and coagulate the same.

The film of aromatic polyamide obtained by the cooling and coagulating was sandwiched in between two ring-shaped frames made of Teflon having an inner diameter of 10 cm, an outer diameter of 15 cm and a thickness of 5 mm and fixed with clips. Incidentally, a filter paper was inserted between the Teflon frame and the film of aromatic polyamide in order to accelerate the drying of the portion sandwiched between the frames.

The film of aromatic polyamide fixed thus between the frames was air-dried for at least 12 hours and thereafter dried at 200° C. for two hours to obtain a transparent aromatic polyamide film. The aromatic polyamide film thus obtained was subjected to a tensile test to obtain the results shown in Table 2.

EXAMPLE 6

The same procedure as in Example 5 was repeated, except that ethanol was substituted for the coagulating solvent, to prepare an aromatic polyamide film. The aromatic polyamide film thus obtained was subjected to a tensile test to obtain the results shown in Table 2.

Comparative Examples 3 to 5

The same procedure as in Example 5 was repeated, except that acetone, toluene or n-hexane which are low in polarity was substituted for the coagulating solvent, to intend to prepare aromatic polyamide films. However, sufficiently coagulated films of aromatic polyamide were not obtained, and hence, the objective aromatic polyamide films were not obtained.

TABLE 2

| | Starting PPTA | Coagulating solvent | | Tensile test | | Appearance, |
|---|---|---|---|---|---|---|
| | η (dl/g) | Kind | Temp. (°C.) | Strength | Modulus | others |
| Ex. 5 | 1.72 | Methanol | ≦−70 | 17.1 | 1040 | Pale yellow, transparent |
| Ex. 6 | 1.79 | Ethanol | ≦−70 | 18.0 | 970 | Pale yellow, transparent |
| Comp. Ex. 3 | 1.72 | Acetone | ≦−70 | — | — | Broken when coagulated |
| Comp. Ex. 4 | 1.72 | Toluene | ≦−70 | — | — | Broken when coagulated |
| Comp. Ex. 5 | 1.72 | n-Hexane | ≦−70 | — | — | Broken when coagulated |

EXAMPLES 7 AND 8

A 500-ml separable flask equipped with an anchor-shaped agitating blade, a Dimroth condenser and a three way stop-cock was sufficiently purged with nitrogen. Into this flask were charged 21.37 g of $CaCl_2$ which had previously been vacuum-dried at 200° C. for at least two hours and 309.0 g of sufficiently dehydrated NMP, and heated with stirring at 100° C. for one hour in an oil bath.

After it was confirmed that the $CaCl_2$ was sufficiently dissolved in the NMP, the NMP solution was allowed to cool to room temperature. To this cooled NMP solution was added 9.70 g (0.0897 mole) of PPD which had been weighed in a dry box and the mixture was stirred to dissolve the PPD in the NMP to prepare a NMP solution of PPD. After it was confirmed that PPD was sufficiently dissolved in the NMP, the NMP solution of PPD was cooled in an ice-water bath.

Subsequently, 17.77 g (0.0875 mole) of TPC which had been weighed in a dry box was added to the NMP solution of PPD. The addition of TPC was effected in several portions under a nitrogen stream over 20 minutes while the inner temperature was kept at 0°–10° C. After completion of the addition of TPC, stirring was continued for one hour while the inner temperature was kept at 0°–5° C. Subsequently, the pressure in the system was reduced by a vacuum pump for a further 30 minutes to remove the low-boiling compounds, after which nitrogen was introduced into the system to restore the inner pressure of the system to ordinary pressure, and polymerization was completed.

The above-mentioned synthesis of an aromatic polyamide was conducted always under a dry nitrogen atmosphere to prevent, as much as possible, the open air, particularly moisture, from being introduced into the system. Thus, an optically isotropic dope of an aromatic polyamide was obtained. The concentration of aromatic polyamide in this dope was 6% by weight, and the inherent viscosity of this aromatic polyamide was 1.91 dl/g.

The thus obtained optically isotropic dope of aromatic polyamide was formed into a thin layer in the same manner as in Example 5 and then cooled and coagulated at a temperatures as shown in Table 3 to prepare films of aromatic polyamide. Subsequently, the films of aromatic polyamide were immersed for 30 minutes in methanol at room temperature to wash. The washed films of aromatic polyamide were air-dried for at least 12 hours and thereafter dried am 100° C. for three hours to obtain aromatic polyamide films. The haze values and tensile test results of the aromatic polyamide films are shown in Table 3.

Comparative Example 6

The same procedure as in Example 7 was repeated, except that the temperature of methanol used in the coagulation was kept at the temperature shown in Table 3, to prepare an aromatic polyamide film. The haze value and tensile test results of the thus obtained aromatic polyamide film are shown in Table 3.

TABLE 3

| | Starting PPTA | Coagulating solvent | | Tensile test | |
|---|---|---|---|---|---|
| | η (dl/g) | Kind | Temp. (°C.) | Strength (kgf/mm²) | Modulus (kgf/mm²) |
| Ex. 7 | 1.91 | Methanol | ≦−70 | 18.4 | 970 |
| Ex. 8 | 1.91 | " | −30 ± 2 | 11.8 | 890 |
| Comp. Ex. 6 | 1.91 | " | −10 ± 2 | 9.7 | 620 |

| | Haze value (%) | Appearance, others |
|---|---|---|
| Ex. 7 | 1.7 | Pale yellow, transparent |
| Ex. 8 | 26.9 | Pale yellow, transparent |
| Comp. Ex. 6 | 91.2 | Pale yellow, opaque |

The aromatic polyamide film excellent in transparency obtained by the process of this invention has excellent heat resistance, chemical resistance, abrasion resistance and electrical insulation, and these properties enable the aromatic polyamide film to be used in a lens-protecting film, a front glass-protecting film for automobile, train, aircraft and the like, a protecting film for viewing window of boiler, a coating tape for wire and optical fiber, a flexible printed circuit board, a recording magnetic tape and the like.

What is claimed is:

1. A process for producing an aromatic polyamide film having an excellent transparency, which comprises the steps of:

(a) forming a thin layer of an optically isotropic dope in which an aromatic polyamide selected from an aromatic polyamide composed of the following recurring structural units (A) and (B):

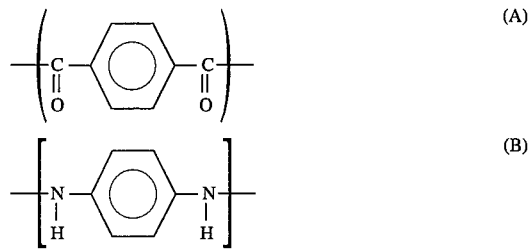

is dissolved in a polar amide, (b) immersing the thin layer dope in a polar solvent, other than said polar amide, kept at a temperature not higher than −20° C. to prepare a film, and (c) drying the film.

2. A process for producing an aromatic polyamide film having an excellent transparency, which comprises the steps of:

(a) forming a thin layer of an optically isotropic dope in which an aromatic polyamide selected from the group consisting of an aromatic polyamide composed of the following recurring structural units (A), (B) and (C):

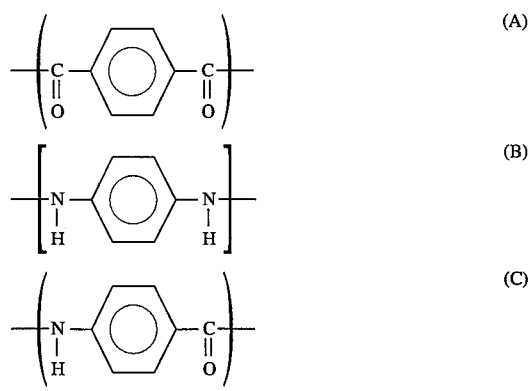

is dissolved in a polar amide, (b) immersing the thin layer dope in a polar solvent, other than said polar amide, kept at a temperature not higher than −20° C. to prepare a film, and (c) drying the film.

3. The process for producing an aromatic polyamide film according to claim 1, wherein the step (a) includes the step of selecting an aromatic polyamide having an inherent viscosity of 1.0 to 2.5 dl/g.

4. The process for producing an aromatic polyamide film according to claim 1, wherein the step (a) includes the steps of:

polymerizing an aromatic diamine with an aromatic dicarboxylic acid halide in the polar amide solution having dissolved therein an alkali metal chloride or an alkaline earth metal chloride to form a solution dissolving the aromatic polyamide and selecting as the dope, the solution or an diluted solution thereof.

5. The process for producing an aromatic polyamide film according to claim 1, wherein the step (a) includes the step of selecting the polar amide from the group consisting of N-methyl-2-pyrrolidinone, N,N-dimethylformamide, N,N-dimethylacetamide and tetramethylurea.

6. The process for producing an aromatic polyamide film according to claim 1, wherein the concentration of the aromatic polyamide in the dope falls within the range of from 1.0% by weight to 4.5% by weight.

7. The process for producing an aromatic polyamide film according to claim 1, wherein the step (b) includes the step of selecting a polar solvent having a solidifying point not higher than −25° C.

8. The process for producing an aromatic polyamide film according to claim 1, wherein the step (b) includes the step of selecting a polar solvent having a dielectric constant of at least 20 at 25° C.

9. The process for producing an aromatic polyamide film according to claim 1, wherein the step (b) includes the step of selecting as the polar solvent, at least one alcohol selected from the group consisting of methanol, ethanol, 1-propanol and 1,3-propanediol or a mixture of the alcohol with at least one of N-methyl-2-pyrrolidinone and water in which mixture the alcohol is the main component.

10. The process for producing an aromatic polyamide film according to claim 1, wherein the step (b) includes the step of selecting as the polar solvent, methanol or ethanol.

11. The process for producing an aromatic polyamide film according to claim 1, further including the step, between the step (b) and the step (c), of washing the film with at least one washing solvent selected from the group consisting of methanol, acetone and water.

12. The process for producing an aromatic polyamide film according to claim 11, wherein the step (b) includes the step of selecting a polar solvent kept at a temperature of −30° C. to −100° C.

13. The process for producing an aromatic polyamide film according to claim 11, wherein the step (b) includes the step of selecting methanol as the washing solvent.

14. The process for producing an aromatic polyamide film according to claim 11, wherein the step (c) includes the step of drying the film at a temperature of from room temperature to 450° C.

15. A process for imparting an excellent transparency to an aromatic polyamide film having high strength and high heat resistance, which comprises the steps of:

(a) selecting as a layer to be formed into film, a thin layer of an optically isotropic dope in which an aromatic polyamide selected from the group consisting of an aromatic polyamide composed of the following recurring structural units (A) and (B):

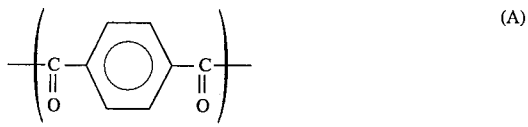

(A)

(B)

is dissolved in a polar amide, (b) immersing the thin layer dope in a polar solvent, other than said polar amide, kept at a temperature not higher than −20° C. to prepare a film, and (c) drying the film.

16. A process for imparting an excellent transparency to an aromatic polyamide film having high strength and high heat resistance, which comprises the steps of:

(a) selecting as a layer to be formed into film, a thin layer of an optically isotropic dope in which an aromatic polyamide selected from the group consisting of an aromatic polyamide composed of the following recurring structural units (A), (B) and (C):

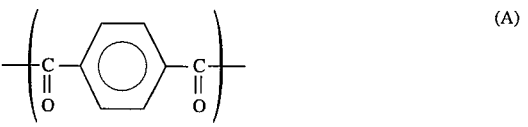

(A)

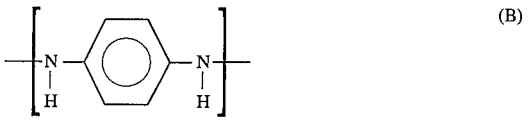

(B)

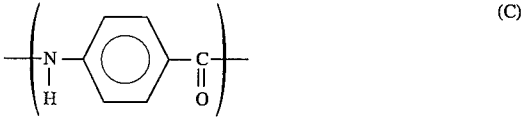

(C)

is dissolved in a polar amide, (b) immersing the thin layer dope in a polar solvent, other than said polar amide, kept at a temperature not higher than −20° C. to prepare a film, and (c) drying the film.

17. The process according to claim 15, wherein the step (a) includes the step of selecting as the dope, a solution or an diluted solution thereof, the solution being obtained by polymerizing an aromatic diamine with an aromatic dicarboxylic acid halide in the polar amide solution having dissolved therein an alkali metal chloride or an alkaline earth metal chloride.

18. The process according to claim 15, further including the step, between the step (b) and the step (c), of washing the film with at least one washing solvent selected from the group consisting of methanol, acetone and water.

* * * * *